United States Patent [19]
Tokutake et al.

[11] Patent Number: 4,985,333
[45] Date of Patent: Jan. 15, 1991

[54] POSITIVE-WORKING PHOTOSENSITIVE COMPOSITION WITH THREE DIFFERENCE 1,2-NAPHTHOQUINONE DIAZIDE SULFONIC ACID ESTERS TO INCLUDE THE ESTER OF CURCUMIN

[75] Inventors: Nobuo Tokutake, Samukawa; Koichi Takahashi, Sagamihara; Yoshiyuki Satoh, Machida; Hidekatsu Kohara, Chigasaki; Toshimasa Nakayama, Hiratsuka, all of Japan

[73] Assignee: Tokyo Ohka Kogyo Co., Ltd., Kanagawa, Japan

[21] Appl. No.: 385,820

[22] Filed: Jul. 27, 1989

Related U.S. Application Data

[63] Continuation-in-part of Ser. No. 274,928, Nov. 22, 1988, abandoned.

[30] Foreign Application Priority Data

Apr. 22, 1988 [JP] Japan ................................. 63-98247

[51] Int. Cl.⁵ .................. G03F 7/023; G03C 1/54; G03C 1/60
[52] U.S. Cl. .................................. 430/192; 430/165; 430/191; 430/193; 430/326; 430/311
[58] Field of Search ............... 430/192, 191, 193, 165, 430/311, 326

[56] References Cited

U.S. PATENT DOCUMENTS

| | | | |
|---|---|---|---|
| 4,499,171 | 2/1985 | Hosaka et al. | 430/192 |
| 4,529,682 | 7/1985 | Toukhy et al. | 430/192 |
| 4,731,319 | 3/1986 | Kohara et al. | 430/192 |
| 4,738,915 | 4/1988 | Komine et al. | 430/192 |
| 4,818,658 | 4/1989 | Martin et al. | 430/192 |
| 4,837,121 | 6/1989 | Blakcney et al. | 430/192 |
| 4,859,563 | 8/1989 | Miura et al. | 430/192 |

Primary Examiner—Charles L. Bowers, Jr.
Attorney, Agent, or Firm—Wyatt, Gerber, Burke and Badie

[57] ABSTRACT

The positive-working photosensitive composition useful as a material of photoresist comprises, in addition to a film-forming resin, such as a cresol novolak resin, and a photosensitive compound, such as an ester of a polyhydroxy benzophenone and 1,2-naphthoquinonediazido-5-sulfonic acid, an esterification product of curcumin with 1,2-naphthoquinone diazide sulfonic acid in a limited amount. The photosensitive composition is outstandingly insusceptible to the adverse influence of halation even when the photoresist layer is formed on a highly reflective aluminum-deposited surface of a substrate without decreasing the photosensitivity of the composition to actinic rays in the photolithographic process for the manufacture of semiconductor devices.

5 Claims, No Drawings

1

POSITIVE-WORKING PHOTOSENSITIVE COMPOSITION WITH THREE DIFFERENCE 1,2-NAPHTHOQUINONE DIAZIDE SULFONIC ACID ESTERS TO INCLUDE THE ESTER OF CURCUMIN

BACKGROUND OF THE INVENTION

This is a continuation in part application from a co-pending U.S. patent application Ser. No. 274,928 filed Nov. 22, 1988, abandoned.

The present invention relates to a novel positive-working photosensitive composition. More particularly, the invention relates to a positive-working photosensitive composition having a high sensitivity to light suitable as a material of photoresist in the manufacture of, for example, semiconductor devices, which is capable of giving a quite satisfactory patterned resist layer of high stability in the shape and dimensions without being influenced by the phenomenon of halation from a substrate of aluminum and the like sometimes unavoidable in the exposure to light.

As is well known, the manufacturing process of various kinds of semiconductor devices such as transistors, ICs, LSIs and the like is performed by the so-called photolithographic or photoetching method, in which a semiconductor silicon wafer is provided with a layer of a photoresist material on the surface and the photoresist layer is exposed patternwise to light through a photomask having a desired pattern followed by a development treatment to partially dissolve the photoresist layer forming a patterned photoresist layer and a subsequent etching treatment of the thus exposed surface of the substrate to prepare for selective diffusion of a dopant. The above mentioned process is usually repeated several times and the selective diffusion treatment of the last time is followed by a treatment for forming a circuit wiring with electrodes of aluminum to complete a semiconductor device.

In the manufacturing process of semiconductor devices described above, it is unavoidable that a stepwise difference in the surface level is formed on the substrate after the selective diffusion treatment. The level difference is usually 1 µm or larger between the raised and recessed areas on the surface after several times repetition of the treatments. The level difference can be even larger when a passivation treatment is undertaken.

A circuit wiring of aluminum is usually formed on the substrate surface by the method of photoetching in which an aluminum layer formed on the substrate surface by vacuum vapor deposition is subjected to patternwise etching with a patterned photoresist layer as an etching resist. When the photoresist layer formed on the surface of an aluminum substrate is exposed to light, an undesirable phenomenon of halation from the aluminum surface is more or less unavoidable. The incident light to the aluminum surface is reflected not only on the flat areas of the surface but also on the side slope at the boundary of the raised and recessed areas forming a difference in the levels. The light irregularly reflected on such a side slope is particularly detrimental in obtaining a high-fidelity reproduction of a fine pattern on the photomask especially when the pattern includes a fine line-wise pattern of, for example, several micrometers width or finer.

Various attempts and proposals have of course been made in the prior art in order to reduce or prevent such an undesirable phenomenon of halation. For example, Japanese Patent Kokai No. 59-142538 teaches a photosensitive composition with admixture of a photoextinctive dye including specific azo compounds having at least one hydroxy group in a molecule. German patent No. DE-OS 35 15 693 teaches a photosensitive composition with admixture of curcumin as a photoextinctive dye.

Although the addition of these photoextinctive dyes to a photosensitive composition is more than fairly effective as compared with conventional photosensitive compositions used as a photoresist material in respect of reducing halation from the substrate surface, the effectiveness thereof is still far from satisfactory in order to comply with the rapidly growing requirements in the modern semiconductor technology progressing along with a trend toward higher and higher fineness of working to such an extent that the phenomenon of halation even in a slightest degree is very detrimental influencing the quality of the product of semiconductor devices.

Moreover, addition of a photoextinctive dye to a photosensitive composition has other problems and disadvantages. When a photoresist layer is formed with a photosensitive composition admixed with such a photoextinctive dye on a substrate surface having a difference in levels as mentioned above, for example, the thickness of the photoresist layer cannot be uniform allover the surface but is larger and smaller on the recessed and raised areas, respectively, demarcated by the line of the level difference on the surface. The effective exposure dose of light is naturally larger in the photoresist layer having a smaller thickness than in the layer having a larger thickness eventually to cause overexposure which is responsible for a decrease in fidelity in the reproduction of a fine pattern to be obtained by the development treatment resulting in an undue decrease of the width or even break of a very fine line pattern and deformation of the cross sectional profile of a line pattern as well as decreased dimensional stability of the resist pattern so that the requirements in the patterning works of the highest fineness cannot be satisfied with such a photosensitive composition. Besides, addition of a photoextinctive dye to a photosensitive composition cannot be a practically feasible method of halation prevention because the light effective for exposure is, as a matter of course, absorbed by the photoextinctive dye to cause a decrease in the sensitivity of the photosensitive compositions so that the throughput in the manufacturing process of semiconductor devices and the like is decreased.

It is also known that a patterned photoresist layer of excellent dimensional stability can be formed by the so-called multilayer method in which an organic film is formed on the substrate surface to exhibit an effect of halation prevention and improvement of the surface flatness. This method is also not practical because the process of this method includes a number of steps and is very complicated.

Thus, it is eagerly desired to develop a high-sensitivity positive-working photosensitive composition capable of giving a patterned monolayer of the photoresist with high dimensional stability, exhibiting an excellent effect of halation prevention.

SUMMARY OF THE INVENTION

The present invention accordingly has an object to provide a positive-working photosensitive composition of high sensitivity capable of giving a finely patterned photoresist layer with excellent stability in the shape and dimensions of the pattern by overcoming the above described problems and disadvantages in the conventional positive-working photosensitive compositions in order to comply with the rapidly growing demand for finer and finer dimensional precision of working in the industrial field of manufacture of semiconductor devices.

Thus, the present invention completed as a result of the extensive investigations undertaken to achieve the above mentioned object provides a positive-working photosensitive composition which comprises, in admixture:

(A) a film-forming resin;
(B) a photosensitive compound; and
(C) an ester of curcumin with 1,2-naphthoquinone diazidosulfonic acid.

In particular, the film-forming resin as the component (A) is preferably a cresol novolak resin and the photosensitive compound (8) is preferably a mixture composed of a first ester of 2,3,4-trihydroxy benzophenone with 1,2-naphthoquinone diazido-5-sulfonic acid and a second ester of 2,3,4,4'-tetrahydroxy benzophenone with 1,2-naphthoquinone diazido-5-sulfonic acid. Further, the amount of the ester of curcumin with 1,2-naphthoquinone diazidosulfonic acid as the component (C) is in the range from 0.5 to 20% by weight based on the total amount of the components (A) and (B).

DETAILED DESCRIPTION OF THE PREFERRED EMBODIMENTS

As is described above, the inventive photosensitive composition comprises as the essential ingredients, the components (A), (B) and (C), of which the most characteristic ingredient is the component (C) which fully exhibits the advantageous effects when the components (A) and (B) are those mentioned above as preferable although any known combinations of a film forming resin as the component (A) and a photosensitive compound as the component (B) can be used to give the base of the inventive photosensitive composition.

Examples of suitable film forming resin include alkali-soluble resins exemplified by novolak resins prepared from a phenolic compound, e.g., phenol, cresol and xylenol, and an aldehyde, e.g., formaldehyde, acrylic resins, polyvinyl alcohols, copolymers of styrene and acrylic acid, polymers of hydroxystyrene, polyvinyl hydroxybenzoates, polyvinyl hydroxybenzals and the like, of which cresol novolak resins are particularly preferred.

More preferably, the cresol novolak resin is prepared from an isomeric mixture of 10 to 45% of m-cresol and 90 to 55% of p-cresol. Still more preferably, the component (A) is a combination of two types of cresol novolak resins of which one is a cresol novolak resin having a weightaverage molecular weight of at least 5000, calculated with reference to polystyrenes, as prepared from an isomeric mixture of 60 to 80% of m-cresol and 40 to 20% of p-cresol and the other is a cresol novolak resin having a weightaverage molecular weight not exceeding 5000, calculated with reference to polystyrenes, as prepared from an isomeric mixture of 10 to 40% of m-cresol and 90 to 60% of p-cresol in such a proportion that the overall cresol moiety in the resin mixture is composed of 30 to 45% of the m-cresol moiety and 70 to 55% of the p cresol moiety. It is of course optional that the m- and p-cresols are combined with a small amount of other phenolic compound such as o-cresol, xylenol and the like according to need. When the inventive photosensitive composition is compounded with the above defined cresol novolak resin as the film forming resin, the composition can give a patterned photoresist layer having particularly high accuracy and stability of dimensions.

Various kinds of known photosensitive compounds can be used as the component (B) in the inventive photosensitive composition. Examples of suitable photosensitive compound include quinone diazide group-containing compounds such as those obtained by the partial or full esterification or by the partial or full amidation of a sulfonic acid derivative of a quinone diazide compound, e.g., benzoquinone diazide, o-naphthoquinone diazide, o-anthraquinone diazide and the like with a compound having a phenolic hydroxy group or an amino group, respectively. The compound having a phenolic hydroxy group is exemplified by polyhydroxy benzophenones such as 2,3,4-trihydroxy benzophenone, 2,2',4,4'-tetrahydroxy benzophenone, 2,3,4,4'-tetrahydroxy benzophenone and the like, gallic acid, alkyl gallates, aryl gallates, partial esters and ethers of gallic acid having a part of the hydroxy groups unesterified or unetherified, phenol, 4-methoxy phenol, dimethyl phenols, hydroquinone, bisphenol A, naphthols, pyrocatechol, pyrogallol, pyrogallol monomethyl ether, pyrogallol 1,3-dimethyl ether and the like and the amino-containing compound is exemplified by aniline, 4-amino diphenyl amine and the like. In particular, the performance of the inventive photosensitive composition is most satisfactory when the component (B) is a mixture of two esters composed of a first ester of 2,3,4-trihydroxy benzophenone with 1,2-naphthoquinone diazido-5-sulfonic acid and a second ester of 2,3,4,4'-tetrahydroxy benzophenone with 1,2-naphthoquinone diazido-5-sulfonic acid. More particularly, the average degree of esterification of the first ester mentioned above should be at least 80% and that of the second ester should be in the range from 50 to 80%. The mixing ratio of the first ester to the second ester is in the range from 5:95 to 55:45 by weight or, preferably, in the range from 20:80 to 40:60 by weight.

The above described photosensitive compound as the component (B) is compounded with the film forming resin as the component (A) in an amount in the range from 10 to 40% by weight based on the resin. When the amount of the photosensitive compound is too small, the photosensitive composition would not give a patterned photoresist layer satisfactory in respect of the cross sectional profile of the line patterns. When the amount thereof is too large, on the other hand, the photosensitive composition would have a greatly decreased sensitivity to light.

The inventive positive-working photosensitive composition is prepared by admixing a base composition composed of the above described components (A) and (B) with a specific additive component as the component (C), which is a mono-or diester of curcumin with 1,2-naphthoquinone diazide sulfonic acid. Such a 1,2-naphthoquinone diazide sulfonate of curcumin is represented by the general formula

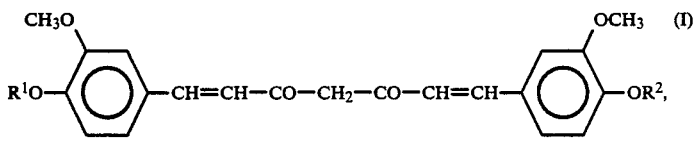

in which R¹ and R² are, each independently from the other, a hydrogen atom or a residue of 1,2-naphthoquinone diazide sulfonic acid expressed by the formula

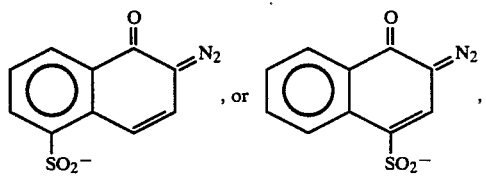

at least one of R¹ and R² being not a hydrogen atom. The 1,2-naphthoquinone diazide sulfonate of curcumin is obtained as a product of the esterification reaction between curcumin and 1,2-naphthoquinone diazide-4-sulfonic acid or 1,2-naphthoquinone diazide-5-sulfonic acid. The reaction is carried out, for example, by admixing curcumin and acid chloride of the above mentioned sulfonic acid in a suitable organic solvent such as dioxane in the presence of a hydrochloric acid acceptor such as triethanol amine so that the esterification reaction proceeds even at room temperature to give the monoester or diester depending on the mixing ratio of the starting compounds. The product of the esterification reaction can be analyzed by the method of gel permeation chromatography for the contents of the diester and monoester of curcumin as well as the unreacted curcumin. The origin of the starting curcumin is not limitative and any product of curcumin can be used equally including synthetic products and natural products obtained by extraction from the rhizomes of *Curcuma longa* belonging to the family of Zingiberaceae and other plants of the same genus.

The thus formed mono- and/or diesters of curcumin need not be isolated from the reaction mixture but the reaction mixture after the esterification reaction can be used as such as the component (C) provided that the average degree of esterification of the starting curcumin is at least 25% or, preferably, in the range from 30% to 80%. The unesterified curcumin in the reaction mixture has no particularly adverse influence or, rather, may exhibit a desirable effect of synergistic halation prevention although an excessively large amount of unesterified curcumin is of course undesirable because the photosensitive composition would not give a patterned photoresist layer having a satisfactory cross sectional profile of line patterns.

The amount of the above described monoester and/or diester of curcumin in the inventive positive-working photosensitive composition ;s in the range from 0.5% to 20% by weight or, preferably, from 1% to 10% by weight based on the total amount of the film-forming resin as the component (A) and the photosensitive compound as the component (B). When the amount thereof is too small, the desired effect of halation prevention cannot be fully exhibited. When the amount thereof is too large, on the other hand, deviation from orthogonal may be caused in the cross sectional profile of line patterns of the photoresist layer obtained from the photosensitive composition. Further, it is preferable that the ratio of the amount of the component (B) to the amount of the component (C) in the inventive composition is in the range from 99:1 to 30:70 by weight.

It is optional according to need that the positive-working photosensitive composition of the invention is admixed with other known additives having miscibility with the essential ingredients including dyes, e.g., coumarin dyes, azo dyes and the like, auxiliary resins, plasticizers and stabilizers as well as coloring agents to improve visibility of the patterned photoresist layer obtained by development.

It is a convenient and advantageous way that the above described photosensitive composition is used in the form of a solution prepared by dissolving the film-forming resin, photosensitive compound, ester compounds of curcumin and optional additives in an organic solvent. Examples of suitable organic solvents include ketones, e.g., acetone, methyl ethyl ketone, cyclohexanone and isoamyl ketone, polyhydric alcohols as well as ethers and esters thereof, e.g., ethylene glycol, propylene glycol, ethylene glycol monoacetate and monomethyl ether, monoethyl ether, mono-n-propyl ether, mono-isopropyl ether, monobutyl ether and monophenyl ether of ethylene glycol or monoacetates thereof, cyclic ethers, e.g., dioxane, and esters, e.g., methyl acetate, ethyl acetate and butyl acetate. These organic solvents can be used either singly or as a mixture of two kinds or more according to need.

Following is a description of a typical procedure for forming a patterned photoresist layer on a substrate surface by using the positive-working photosensitive composition of the invention. Thus, the surface of a substrate, such as a semiconductor silicon wafer, is coated with the inventive photosensitive composition, preferably, in the form of a solution by using a suitable coating machine such as a spinner and dried to form a photosensitive layer which is then exposed patternwise to ultraviolet light on an apparatus for exposure such as a minifying projection exposure equipment through a photomask bearing a desired pattern. The latent image thus formed is then developed by a development treatment using a developer solution which is preferably an aqueous solution of an organic alkali such as tetramethyl ammonium hydroxide and choline in a concentration of 2 to 5% by weight so that the composition is dissolved away from the areas exposed to light as a result of increased solubility leaving the composition on the unexposed areas to give a patterned resist layer which is a high fidelity reproduction of the patterned image on the photomask.

In the above described process, the component (C), i.e. specific esters of curcumin, added to the inventive photosensitive composition has an effect to enhance the solubility of the composition in an alkaline developer solution on the areas exposed to actinic rays while the solubility of the composition n the alkaline developer solution is decreased thereby on the areas unexposed to the actinic rays. Accordingly, the patterned photoresist layer obtained from the inventive photosensitive composition is very excellent in respect of the stability and accuracy of dimensions. As compared with conventional photoextinctive dyes used as a halation-preventing agent, moreover, the specific ester compounds of curcumin as the component (C) in the inventive photosensitive composition is free from the problem of decreasing the sensitivity of the composition so that the inventive photosensitive composition is industrially very advantageous because the throughput of the process for the manufacture of semiconductor devices using the inventive composition can be as high as in the use of a photosensitive composition containing no halation preventing agent. In contrast to the multilayered structure of a photoresist layer using an organic film having a halation-preventing effect formed on the surface of a substrate provided with a vapor-deposited layer of aluminum to compensate the insufficient halation-preventing effect of conventional positive-working photosensitive compositions, a practically sufficient effect of halation prevention can be obtained by using the inventive photosensitive composition even to form a single coating layer by omitting such an organic layer on an aluminum-deposited substrate surface so that the manufacturing process of semiconductor devices can be greatly simplified.

In the following, examples are given, as preceded by the description of the synthetic procedure of the specific ester compound of curcumin used as the component (C) as well as the photosensitive compound as the component (B), to illustrate the positive-working photosensitive composition of the invention in more detail but not to limit the scope of the invention in any way.

PREPARATION EXAMPLE 1

A solution of 8 g of triethanol amine in 32 ml of dioxane was added dropwise to a mixture prepared by dissolving 10 g of curcumin and 7.2 g of 1,2-naphthoquinone diazide-5-sulfonyl chloride in 350 ml of dioxane under vigorous agitation at room temperature over a period of 1 hour. Thereafter, a diluted hydrochloric acid prepared by diluting 25 g of a 35% hydrochloric acid with 1000 g of deionized water was added to the reaction mixture to precipitate the reaction product. The precipitates were collected by filtration and thoroughly washed with deionized water, dehydrated and dried. The thus obtained product was an esterification product of curcumin of which the average degree of esterification of the starting curcumin was 50%.

PREPARATION EXAMPLE 2

The procedure for the preparation was substantially the same as in Preparation Example 1 described above except that the amount of 1,2-naphthoquinone diazide-5-sulfonyl chloride was decreased to 3.6 g. The thus obtained product was an esterification product of curcumin of which the average degree of esterification of the starting curcumin was 25%.

PREPARATION EXAMPLE 3

The procedure for the preparation was substantially the same as in Preparation Example 1 described above except that the amount of 1,2-naphthoquinone diazide-4-sulfonyl chloride was increased to 10.8 g. The thus obtained product was an esterification product of curcumin of which the average degree of esterification of the starting curcumin was 75%.

PREPARATION EXAMPLE 4

The procedure for the preparation was substantially the same as in Preparation Example 1 described above except that the amount of 1,2-naphthoquinone diazide-4-sulfonyl chloride was increased to 14.5 g. The thus obtained product was an esterification product of curcumin of which the average degree of esterification of the starting curcumin was approximately 100% corresponding to a substantially pure diester of curcumin.

PREPARATION EXAMPLE 5

A solution of 7.7 g of triethanol amine in 32 g of dioxane was added dropwise to a solution of 2.0 g of 2,3,4-trihydroxy benzophenone and 7.0 g of 1,2-naphthoquinone-diazido-5-sulfonyl chloride in 350 ml of dioxane under vigorous agitation over a period of 1 hour to effect the esterification reaction. In the next place, the reaction mixture was admixed with a diluted hydrochloric acid which was a mixture of 25 g of 35% hydrochloric acid and 1000 g of water to precipitate the reaction product. The precipitates collected by filtration were thoroughly washed with water and dried to give an esterification product of 2,3,4-trihydroxy benzophenone of which the average degree of esterification was 90%.

PREPARATION EXAMPLE 6

The experimental procedure was substantially the same as in Preparation Example 5 described above except that the amount of 1,2-naphthoquinone diazido 5-sulfonyl chloride was decreased to 3.5 g. The thus obtained esterification product had an average degree of esterification of 50%.

PREPARATION EXAMPLE 7

The experimental procedure was substantially the same as in Preparation Example 5 described above except that 2,3,4-trihydroxy benzophenone was replaced with the same amount of 2,3,4,4'-tetrahydroxy benzophenone and the amount of 1,2-naphthoquinonediazido-5-sulfonyl chloride was decreased to 5.7 g. The thus obtained esterification product of 2,3,4,4'-tetrahydroxy benzophenone had an average degree of esterification of 65%.

EXAMPLE 1

A coating solution was prepared by admixing a comercial product of a solution-type positive working photoresist composition containing 27% by weight of the non-volatile matter composed of a phenol novolak resin and a photosensitizing ingredient including o-naphthoquinone diazide compound (OFPR-800, a product by Tokyo Ohka Kogyo Co.) with the esterification product obtained in Preparation Example 1 in an amount of 3% by weight relative to the non-volatile material therein followed by filtration through a membrane filter having a pore diameter of 0.2 μm.

The thus prepared coating solution of the photosensitive composition was uniformly applied by using a spinner to the surface of a semiconductor silicon wafer of 4-inches diameter provided with a vapor-deposited aluminum coating layer and having a difference ;n the surface levels of 1.0 μm. The coating layer of the photosensitive composition had a thickness of 2.0 μm as dried. After evaporation of the solvent from the coating layer, the silicon wafer was mounted and prebaked for 90 seconds on a hot plate kept at 110° C. to complete the coating layer of the photosensitive composition.

The coating layer of the photosensitive composition on the substrate surface was exposed patternwise to ultraviolet light through a test-chart photomask on a minifying projection exposure equipment (Wafer Stepper Model 1505 G3A, manufactured by Nikon Co.) and subjected to a development treatment at 23° C. taking 30 seconds by use of a 2.38% by weight aqueous solution of tetramethyl ammonium hydroxide to form a patterned photoresist layer on the surface. Electron microscopic examination of the thus formed photoresist pattern indicated that the pattern was a high-fidelity reproduction of the photomask pattern of 0 8 μm line width with sharpness even on the raised areas at the level difference where the thickness of the photoresist layer was relatively small. The cross sectional profile of the line pattern was orthogonal on the substrate surface.

The photosensitivity of the photoresist layer was evaluated by determining the minimum exposure time by which a line-and-space pattern of the resist layer having a width of 1.0 μm of the lines and spaces could be obtained with full fidelity to give a result of 150 m seconds.

EXAMPLE 2

Two cresol novolak resins I and II were prepared from a mixture of m- and p-cresols and formalin in the presence of oxalic acid as a catalyst according to a conventional procedure. The resin I, which had a weight-average molecular weight of 28,000, was prepared from a mixture of m- and p-cresols in a ratio of 60:40 and the resin II, which had a weight-average molecular weight of 2000, was prepared from a mixture of m- and p-cresols in a ratio of 40:60.

A photosensitive composition in the form of a solution was prepared by dissolving 25 parts by weight of the cresol novolak resin I, 75 parts by weight of the cresol novolak resin II, 30 parts by weight of a reaction product of 1.0 mole of 2,3,4-trihydroxy benzophenone and 1.6 moles of naphthoquinone-1,2-diazide sulfonyl chloride and the esterification product of curcumin obtained in Preparation Example 2 in an amount of 3% by weight based on the total amount of the above three ingredients together in 390 parts by weight of ethylene glycol monoethyl ether acetate followed by filtration through a membrane filter of 0.2 μm pore diameter.

A patterned photoresist layer was formed on a silicon wafer in substantially the same manner as in Example 1 using the above prepared photosensitive composition. An electron microscopic examination indicated that the quality of the line-and-space pattern of the resist layer was as satisfactory as in Example 1. The minimum exposure time determined in the same manner as in Example 1 was 160 m seconds as a measure of the photosensitivity of the photosensitive composition.

EXAMPLE 3

A line-and-space pattern of a photoresist layer was formed on a silicon wafer in the same manner as in Example 1 except that the photosensitive composition used therefor was formulated by using, instead of 3% by weight of the esterification product of curcumin prepared in Preparation Example 1, a combination of 2% by weight of the esterification product of curcumin prepared in Preparation Example 3 and 1% by weight of 1-ethoxy-4-(4'-N,N-diethylaminophenylazo) benzene.

An electron microscopic examination indicated that the quality of the line-and-space pattern of the resist layer was as satisfactory as in Example 1. The minimum exposure time determined in the same manner as in Example 1 was 170 m seconds as a measure of the photosensitivity of the photosensitive composition.

EXAMPLE 4

A line-and-space pattern of a photoresist layer was formed on a silicon wafer in the same manner as in Example 1 except that the photosensitive composition used therefor was formulated by using, instead of 3% by weight of the esterification product of curcumin prepared in Preparation Example 1, 3% by weight of the esterification product of curcumin prepared in Preparation Example 4.

An electron microscopic examination of the thus formed patterned photoresist layer indicated that the quality of the pattern was satisfactory practically with no problems at least on the flat areas although a slight influence of halation in the lateral direction was noted at and in the vicinity of the boundary areas with a difference in the surface levels. The minimum exposure time determined in the same manner as in Example 1 was 160 m seconds as a measure of the photosensitivity of the photosensitive composition.

COMPARATIVE EXAMPLE 1

A line-and-space pattern of a photoresist layer was formed on a silicon wafer in the same manner as in Example 1 except that the photosensitive composition used therefor was formulated by using, instead of 3% by weight of the esterification product of curcumin prepared in Preparation Example 1, the same amount of curcumin.

An electron microscopic examination of the thus formed line-and-space pattern indicated that the patterned lines had a cross section with rounded shoulders so that the quality of the pattern was less satisfactory. The minimum exposure time determined in the same manner as in Example 1 was 170 m seconds as a measure of the photosensitivity of the photosensitive composition.

EXAMPLE 5

A cresol novolak resin having a weight-average molecular weight of 2000 was prepared from a mixture of m- and p-cresols in a ratio of 40:60 by the condensation reaction with formalin in a conventional manner. A photosensitive composition in the form of a solution was prepared by dissolving 100 parts by weight of the cresol novolak resin, 30 parts by weight of an ester of 2,3,4-trihydroxy benzophenone and naphthoquinone-1,2-diazide sulfonic acid and the esterification product of curcumin obtained in Preparation Example 1 in an amount of 3% by weight based on the total amount of the above two ingredients together in 390 parts by weight of ethylene glycol monoethyl ether acetate followed by filtration through a membrane filter of 0.2 μm pore diameter.

A patterned photoresist layer was formed on a silicon wafer in substantially the same manner as in Example 1 using the above prepared photosensitive composition. An electron microscopic examination indicated that the quality of the line-and-space pattern of the resist layer was as satisfactory as in Example 1 with an orthogonal cross section of the line pattern. The minimum exposure time determined in the same manner as in Example 1 was 150 m seconds as a measure of the photosensitivity of the photosensitive composition.

EXAMPLE 6

The experimental procedure was substantially the same as in Example 5 except that 3% by weight of the esterification product of curcumin prepared in Preparation Example 1 was replaced with a combination of 1.5% by weight of the esterification product of curcumin prepared in Preparation Example 4 and 1.5% by weight of curcumin. An electron microscopic examination of the thus formed line-and-space pattern indicated that the quality of the line-and-space pattern of the photoresist layer was quite as satisfactory as in Example 1. The minimum exposure time determined in the same manner as in Example 1 was 160 m seconds as a measure of the photosensitivity of the photosensitive composition.

COMPARATIVE EXAMPLE 2

A line-and-space pattern of a photoresist layer was formed on a silicon wafer in the same manner as in Example 1 except that the photosensitive composition used therefor was formulated by using, instead of 3% by weight of the esterification product of curcumin prepared in Preparation Example 1, the same amount of 4-ethoxy-4'-diethylamino azobenzene.

An electron microscopic examination of the thus formed line-and-space pattern indicated that the patterned lines had a cross section with rounded shoulders so that the quality of the pattern was less satisfactory. The minimum exposure time determined in the same manner as in Example 1 was 450 m seconds as a measure of the photosensitivity of the photosensitive composition.

EXAMPLE 7

A cresol novolak resin was prepared by adding 110 parts by weight of a 30% formalin and 5 parts by weight of oxalic acid to a mixture of 40 parts by weight of m-cresol and 60 parts by weight of p-cresol and heating the mixture for 100 minutes under boiling followed by dehydration under reduced pressure. A coating solution of a photosensitive composition was prepared by dissolving 100 parts by weight of the thus prepared cresol novolak resin, 10 parts by weight of the esterification product prepared in Preparation Example 5, 20 parts by weight of the esterification product prepared in Preparation Example 7 and the esterification product of curcumin prepared in Preparation Example 1 in an amount of 3% by weight based on the solid content of the other ingredients in 390 parts by weight of ethylene glycol monoethyl ether acetate and filtering the solution through a membrane filter of 0.2 μm pore diameter.

A silicon wafer was coated with this coating solution and the coating layer was patterned in the same manner as in Example 1. Electron microscopic examination of the thus formed pattern indicated that the pattern having a line width of 0.8 μm was a reproduction of the photomask pattern with high fidelity even in the upside areas on the level difference lines where the coating layer had a relatively small thickness as compared with the downside areas. The cross sectional profile of the line pattern was precisely orthogonal rising upright on the substrate surface.

The photosensitivity of the photoresist layer was evaluated by determining the minimum exposure time by which a line-and-space pattern of the resist layer having a width of 1.0 μm of the lines and spaces could be obtained with full fidelity to give a result of 200 m seconds.

EXAMPLES 8 TO 17 AND COMPARATIVE EXAMPLES 3 AND 4

The procedure in each of these Examples and Comparative Examples was substantially the same as in Example 7 excepting modification of the ratio of the m-cresol to p-cresol in the preparation of the cresol novolak resins, the kind and amount of the photosensitive compounds and the kind and amount of the esterification products of curcumin being shown in Table 1 below. In the Table, the photosensitive compounds IV, V and VI were each the product obtained in Preparation Examples 4, 5 and 6, respectively, and the esterification products of curcumin I, II, III and IV are each the product obtained in preparation Examples 1, 2, 3 and 4, respectively. The amount of the curcumin ester indicated in % by weight in Table 1 is based on the total amount of the cresol novolak resin taken in an amount of 100 parts by weight and the photosensitive compounds taken each in an amount indicated in parts by weight in Table 1 in the brackets. The table gives the results of the photosensitivity in m seconds determined in the same manner as in Example 1 and the cross sectional profile of the line pattern in each of the Examples and Comparative Examples. The cross sectional profile is shown by the symbols a, b or c corresponding to an upright-standing orthogonal form, an upright-standing form with rounded shoulders and a form with trailing skirts and rounded shoulders, respectively.

TABLE

|  |  | m-cresol: p-cresol ratio | Photosensitive compound (parts by weight) | Curcumin ester (% by weight) | | Cross sectional profile | Photosensitivity, m seconds |
|---|---|---|---|---|---|---|---|
| Example | 8 | 40:60 | V (15) VII (15) | I | (3) | a | 200 |
|  | 9 | 20:80 | V (10) VII (20) | II | (3) | a | 250 |
|  | 10 | 35:65 | V (10) VII (20) | III | (3) | a | 220 |
|  | 11 | 15:85 | V (10) VII (20) | IV | (3) | a | 270 |
|  | 12 | 43:57 | V (10) VII (20) | IV | (1.5) | b | 180 |
|  | 13 | 40:60 | VI (10) VII (20) | I | (3) | b | 150 |
|  | 14 | 60:40 | V (10) VII (20) | I | (3) | b | 150 |
|  | 15 | 40:60 | V (20) | I | (3) | a | 550 |

TABLE-continued

|  |  | m-cresol: p-cresol ratio | Photosensitive compound (parts by weight) | Curcumin ester (% by weight) |  | Cross sectional profile | Photosensitivity, m seconds |
|---|---|---|---|---|---|---|---|
|  | 16 | 47:53 | VII (10) V (10) | I | (3) | b | 280 |
|  | 17 | 40:60 | VII (20) V (5) | I | (17) | b | 400 |
|  |  |  | VII (10) |  |  |  |  |
| Comparative | 3 | 40:60 | — | IV | (30) | c | 800 |
| Example | 4 | 40:60 | V (2) VII (4) | IV | (30) | c | 900 |

What is claimed is:

1. A positive-working photosensitive composition which consists essentially of, in admixture:
   (A) a film-forming cresol novolak resin; wherein said resin is composed of from 10 to 45% by weight of m-cresol moiety and from 90 to 95% of p-cresol moiety,
   (B) a photosensitive mixture comprising a first ester of 2, 3, 4-trihydroxy benzophenone with 1, 2-naphthoquinonediazido-5-sulfonic acid and a second ester of 2, 3, 4, 4'-tetrahydroxy benzophenone with 1, 2-naphthoquinonediazido-5-sulfonic acid, wherein the average degree of esterification of the first ester comprises at least 80%, the average degree of esterification of the second ester comprises from 50% to 80%, and the ratio of the amount of the first ester to the amount of the second ester comprises from 5:95 to 55:45 by weight; and,
   (C) an ester of curcumin with 1, 2-naphthoquinone diazidosulfonic acid, wherein the average degree of esterification of said ester of curcumin comprises from 30% to 80%; and,
   wherein, the ratio of the amount of component (B) to the amount of component (C) comprises from 99:1 to 30:70 by weight.

2. The positive-working photosensitive composition as claimed in claim 1 wherein the amount of the ester of curcumin with 1,2-naphthoquinone diazide sulfonic acid as the component (C) is in the range from 0.5 to 20% by weight based on the total amount of the components (A) and (B).

3. The positive-working photosensitive composition as claimed in claim 1 wherein the average degree of esterification of the ester of curcumin with 1,2-naphthoquinone diazide sulfonic acid is at least 25%.

4. The positive-working photosensitive composition as claimed in claim 1 wherein the ratio of the amount of the first ester to the amount of the second ester is in the range from 20:80 to 40:60 by weight.

5. The positive-working photosensitive composition as claimed in claim 1 wherein the film-forming resin as the component (A) is a cresol novolak resin.

* * * * *